(12) United States Patent
Mun et al.

(10) Patent No.: US 11,737,210 B2
(45) Date of Patent: Aug. 22, 2023

(54) PRINTED CIRCUIT BOARD

(71) Applicant: SAMSUNG ELECTRO-MECHANICS CO., LTD., Suwon-si (KR)

(72) Inventors: Seong Jae Mun, Suwon-si (KR); Jong Chan Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/241,357

(22) Filed: Apr. 27, 2021

(65) Prior Publication Data

US 2022/0030713 A1 Jan. 27, 2022

(30) Foreign Application Priority Data

Jul. 24, 2020 (KR) ........................ 10-2020-0092417

(51) Int. Cl.
*H05K 1/11* (2006.01)

(52) U.S. Cl.
CPC ....... *H05K 1/113* (2013.01); *H05K 2201/096* (2013.01); *H05K 2201/09827* (2013.01)

(58) Field of Classification Search
CPC ... H05K 2201/09827; H05K 2201/096; H05K 1/113; H05K 1/11

USPC ........................................................ 174/264
See application file for complete search history.

(56) References Cited

U.S. PATENT DOCUMENTS 9,997,450 B2 * 6/2018 Oi ..................... H01L 23/49838
2008/0023218 A1    1/2008 Nishu et al.

FOREIGN PATENT DOCUMENTS

| JP | 3641372 B2 | 1/2005 |
| JP | 4932370 B2 | 2/2012 |
| KR | 10-2061921 B1 | 1/2020 |
| WO | 2013/092131 A1 | 6/2013 |

* cited by examiner

*Primary Examiner* — Tremesha S Willis
(74) *Attorney, Agent, or Firm* — Morgan, Lewis & Bockius LLP

(57) ABSTRACT

A printed circuit board includes an insulating layer; a metal pad disposed on one side of the insulating layer; a via hole penetrating through the insulating layer to expose at least a portion of the metal pad; and a via filling at least a portion of the via hole, wherein the via comprises a first metal layer and a second metal layer disposed on the first metal layer, and an average size of grains in the first metal layer and an average size of grains in the second metal layer are different from each other.

20 Claims, 4 Drawing Sheets

PRINTED CIRCUIT BOARD

CROSS-REFERENCE TO RELATED APPLICATION(S)

This application claims benefit of priority to Korean Patent Application No. 10-2020-0092417 filed on Jul. 24, 2020 in the Korean Intellectual Property Office, the disclosure of which is incorporated herein by reference in its entirety.

TECHNICAL FIELD

The present disclosure relates to a printed circuit board.

BACKGROUND

It is preferable that when a via is formed on a printed circuit board, a filled-type via in which an internal space thereof is filled with a metal material formed for high heat dissipation properties, and the like. Due to limitations on currently developed technologies, however, large-sized filled-type vias have the problems with voids and dimples. In this case, not only reliability of the board can be problematic but also it may be difficult to implement a stack via structure advantageous in board heat dissipation or signal delivery properties. Meanwhile, vias are generally formed to extend onto a board when an internal space thereof is filled. In this case, a metal layer extending onto the board has a high thickness, and an additional process, such as etching, or the like, may be necessary to reduce the thickness of the thick metal layer.

SUMMARY

An aspect of the present disclosure is to provide a printed circuit board capable of preventing occurrence of voids in a via.

Another aspect of the present disclosure is to provide a printed circuit board having excellent reliability.

Another aspect of the present disclosure is to provide a printed circuit board capable of preventing occurrence of dimples of a via.

Another aspect of the present disclosure is to provide a printed circuit board including a stack via.

Another aspect of the present disclosure is to provide a printed circuit board having excellent heat dissipation properties.

Another aspect of the present disclosure is to provide a printed circuit board capable of rapid signal delivery.

Another aspect of the present disclosure is to provide a printed circuit board capable of reducing a plating thickness.

Another aspect of the present disclosure is to provide a printed circuit board having simplified manufacturing processes and reduced manufacturing costs.

According to an aspect of the present disclosure, a printed circuit board includes an insulating layer; a metal pad disposed on one side of the insulating layer; a via hole penetrating through the insulating layer to expose at least a portion of the metal pad; and a via filling at least a portion of the via hole, wherein the via includes a first metal layer and a second metal layer disposed on the first metal layer, and an average size of grains in the first metal layer and an average size of grains in the second metal layer are different from each other.

According to another aspect, a printed circuit board includes an insulating layer; a metal pad disposed on one side of the insulating layer; a via hole penetrating through the insulating layer to expose at least a portion of the metal pad; and a via filling at least a portion of the via hole, wherein the via comprises a second metal layer including a first region and a second region and a second metal layer disposed on the first metal layer, and average sizes of grains in the first region and the second region of the first metal layer are different from each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, embodiments of the present disclosure will be described as follows with reference to the attached drawings.

Printed Circuit Board

Figure 1:
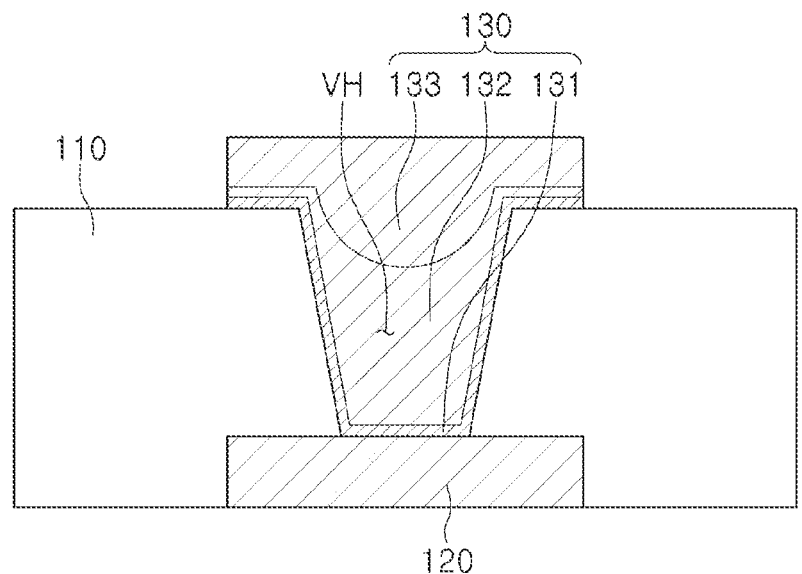
FIG. 1 is a cross-sectional view schematically illustrating a printed circuit board according to an example embodiment of the present disclosure.

FIG. 1 is a cross-sectional view schematically illustrating a printed circuit board according to an example embodiment of the present disclosure.

Figure 2:
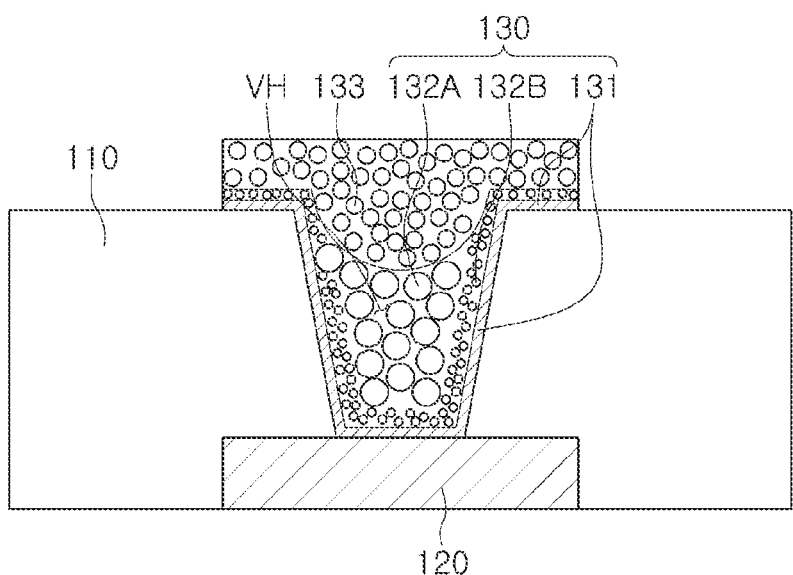
FIG. 2 is a diagram illustrating an average size of grains in each region of a metal layer of a printed circuit board according to an example embodiment.

FIG. 2 is a diagram illustrating an average size of grains in each region of a metal layer of a printed circuit board according to an example embodiment.

Large and small average sizes of grains are based on an average value of the grain sizes included in each region. The average size of grains may be based on an average particle diameter of the grains included in each region.

It is obvious that an actual average size of grains in each region of the metal layer may be different from that illustrated in the drawings. In addition, it is illustrated in the drawings that a void is present between grains; however, a void may be actually filled with grains.

Based on the drawings, a printed circuit board according to an example embodiment includes an insulating layer 110, a metal pad 120, a via hole VH and a via 130.

Although not particularly limited, the insulating layer 110 may be formed of a thermosetting insulating resin such as an epoxy resin, or a thermoplastic insulating resin such as polyimide or a resin, wherein the a thermosetting or thermoplastic resin together with an inorganic filler may be impregnated in a base material such as a glass cloth, glass fabric, or the like. For example, prepreg, Ajinomoto build-up film (ABF), or the like, may be used. If necessary, a photo imagable dielectric (PID) may be used.

The metal pad 120 is disposed on one side of the insulating layer 110. As illustrated in the drawings, the metal pad 120 may be embedded in one side of the insulating layer 110, or contrary to the drawings, may be disposed on one side of the insulating layer 110. Further, when the insulating layer 110 is provided in plural, the metal pad 120 is disposed on each of the insulating layers 110 and covered by the insulating layer 110 disposed on another layer.

The metal pad 120 may have various functions according to a design thereof; for example, the metal pad 120 may function as a wire or a heat delivery path. The metal pad 120 may include a metal material such as Cu, Al, Ag, Sn, Au, Ni, Pb, Ti or alloys thereof.

The via hole VH penetrates the insulating layer 110 to expose at least a portion of the metal pad 120. Accordingly, a wall surface of the via hole VH is surrounded by the insulating layer 110, and the metal pad 120 is disposed on a bottom surface of the via hole VH. A shape of the via hole VH is not particularly limited, but may have, for example, a cylindrical shape, a tapered shape having a width reduced in a direction in which the via hole VH penetrates the insulating layer 110 toward the metal pad. A method for forming the via hole VH is not limited, but may include, for example, laser processing, mechanical processing, and the like.

The via 130 may fill at least a portion of the via hole VH and may be connected to the metal pad 120. The via 130 includes a first metal layer 131, a second metal layer 132 disposed on the first metal layer 131 and a third metal layer 133 disposed on the second metal layer 132. Depending on a design thereof, however, the via 130 may include the second metal layer 132 and the third metal layer 133 disposed on the second metal layer 132 only and may not include the first metal layer 131.

Meanwhile, the first to third metal layers 131 to 133 may extend onto a top surface of the insulating layer 110. This may enable the first to third metal layers 131 to 133 to act as a via land or to be connected to a wiring layer disposed on the same layer. As set forth below, however, the second metal layer 132 may not extend onto the top surface of the insulating layer 110 and may only fill an internal space of the via hole VH. In this case, the third metal layer 133 on the one surface of the insulating layer 110 may be disposed directly on the first metal layer 131.

The first metal layer 131 covers at least a portion of the wall surface of the via hole VH and at least a portion of a region of the metal pad 120 exposed through the via hole VH. The first metal layer 131 may extend onto the one top surface of the insulating layer 110.

A method for forming the first metal layer 131 is not particularly limited, but may be electroless plating or electrolytic plating. The first metal layer 131 may be a seed layer introduced to enhance bonding force between the insulating layer 110 and the second metal layer 132.

Depending on cases, a printed circuit board may not include the first metal layer 131. For example, in the case in which the first insulating layer 110 is formed of a material having excellent bonding force to a metal, the first metal layer functioning as a seed layer may not be necessary. In this case, the second metal layer 132 covers at least a portion of the wall surface of the via hole VH and at least a portion of the region of the metal pad 120 exposed through the via hole VH and may fill a portion of the via hole VH.

The second metal layer 132 covers at least a portion of the first metal layer 131 and partially fills the via hole VH. Further, the second metal layer 132 may extend onto a top surface of the insulating layer 110 and may be disposed on the first metal layer 131 disposed on the top surface of the insulating layer 110.

A thickness of the second metal layer 132 disposed on the top surface of the insulating layer may be significantly small, and may be, for example, smaller than the third metal layer 133. When the thickness of the second metal layer 132 is small on the top surface of the insulating layer, an overall thickness of the metal layer extended onto the top surface of the insulating layer 110 may be reduced. A method of measurement of the thickness of the second metal layer includes, but not limited to, methods of measurement of the thickness of the second metal layer, which is appreciated by the one skilled in the art.

Meanwhile, the second metal layer 132 may not extend onto the top surface of the insulating layer 110 and may fill the via hole VH only. In this case, the third metal layer 133 may be disposed directly on the first metal layer 131 on the top surface of the insulating layer 110. Alternately, in the case in which the via 130 does not include the first metal layer 131, the third metal layer 133 may be disposed directly on the insulating layer 110 on the top surface of the insulating layer 110.

Meanwhile, as illustrated in the drawing, the second metal layer 132 may have a concave portion indented towards the metal pad 120 on an interface between the second and third metal layers 132 and 133. Accordingly, the thickness of the second metal layer 132 near the center of the via may be smaller than that towards the periphery of the via 130 in a thickness direction of the insulating layer. For example, the thickness of the second metal layer 132 may increase in a direction from the center of the concave portion towards the periphery of the via 130. Meanwhile, at least a portion of the concave portion may be filled with the third metal layer 133. In the drawing, the concave portion is illustrated to have a curved shape, but is not limited thereto.

The second metal layer 132 may be formed by electrolytic plating, and specifically may be formed by pulse periodical reverse (PPR) involving periodically reversing a direction of a pulse current. The PPR plating may facilitate formation of the second metal layer 132, thereby primarily filling a portion of the via hole VH with significantly large grains.

Meanwhile, a plating solution used in the PPR plating may include an additive such as an accelerator, a suppressor, and the like, and may not include a leveler. The PPR plating is carried out to fill the via hole VH, and this is because a surface of a plating layer is not required to be uniformly formed or to extend onto the one surface of the insulating layer 110. As the leveler functions as an electrochemically weak inhibitor, there may rather be an adverse effect that it is difficult to fill the via hole without having a void generated when the plating solution used in the PPR plating includes a leveler.

Meanwhile, during the PPR plating, it may be preferable that an average current density of a forward current and a reverse current during PPR plating is 0.5 ASD (amps per square decimeter) or more and 5 ASD or less. If the average current density is less than 0.5 ASD, a plating time may become longer, and if the average current density is more than 5 ASD, a side effect of forming uneven plating may occur. On the other hand, an inside of the via hole could be efficiently filled with a large grain size without voids when plating under the condition that the average current density is 0.5 ASD or more and 5 ASD or less during PPR plating. Meanwhile, it may be preferable that a current include at least one reverse current at the time of PPR plating. When a reverse current is applied, two effects can be expected. First, a reverse current may enable the via to be filled while maintaining a thickness of the plating layer on the insulating layer to be small since an amount of the plating layer etched on the insulating layer is larger than that inside the via due to a difference in resistance between both electrodes. Further, the reverse current may enable an arrangement of an additive on the insulating layer and inside the via to be adjusted to be different. The reverse current may cause desorption of the additive and may have the accelerator feasible of adhesion under a relatively slow flow rate condition concentrated inside the via. To have such an effect, that is, having a relatively increased plating amount inside the via while having a plating thickness small on the insulating layer, it is preferable that a time for the reverse current be 10 ms or more.

Meanwhile, it may be preferable that a cycle time be 100 ms at the time of PPR plating. When the cycle time is less than 100 ms, adsorption and desorption of the additive become unstable, causing differences in additive distribution and arrangement in each region in a product. This may result in an adverse effect of non-uniform plating.

The second metal layer 132 has a first region 132A and a second region 132B. The first region 132A of the second metal layer 132 is disposed inside the via 130, and the second region 132B of the second metal layer 132 is disposed outside the via 130 and can surround the first region 132A of the second metal layer 132.

Meanwhile, average sizes of grains in the first region 132A and the second region 132B of the second metal layer 132 are different from each other. Specifically, the average size of grains in the first region 132A of the second metal layer 132 may be larger than that in the second region 132B of the second metal layer 132.

When the PPR electrolytic plating is carried out, it was confirmed that the second region 132B of the second metal layer 132 having a significantly small average size of grains is formed to surround the first region 132A of the second metal layer 132 having a large average size of grains.

In addition, the average size of grains in the second metal layer 132 and that of the third metal layer 133 may be different from each other. For example, the average size of grains in the second metal layer 132 may be larger than that of the third metal layer 133. The second metal layer 132 formed through the PPR electrolytic plating may have a relatively large average size of grains.

Depending on conditions of the second metal layer 132 formation, however, the average size of grains in the second metal layer 132 may be smaller than that of the third metal layer 133. For example, in the case in which the second region 132B of the second metal layer 132 is formed to be large, the average size of grains may be reduced in an entire region of the second metal layer 132. In the case, the average size of grains in the second metal layer 132 may be smaller than that of the third metal layer 133. A method of measurement of the grain sizes of the first, second and third metal layers includes, but not limited to, methods of measurement of the thickness, which is appreciated by the one skilled in the art.

The third metal layer 133 may be disposed on the second metal layer 132 and fill the remaining portion of the via hole VH. Alternately, the third metal layer 133 may extend onto the top surface of the insulating layer 110 and be disposed on the first or second metal layer 131 or 132. In this case, a thickness of the third metal layer 133 disposed on the top surface of the insulating layer 110 may be greater than that of the second metal layer 132.

Meanwhile, as illustrated in the drawings, the third metal layer 133 may fill at least a portion of the concave portion of the second metal layer 132. Accordingly, the third metal layer 133 may have a protrusion which protrude towards the bottom of via.

The third metal layer 133 may be formed by electrolytic plating, specifically direct current (DC) plating. The third metal layer 133 having a relatively small average size of grains may secondarily fill the remaining via hole VH by forming the third metal layer 133 by DC plating.

A plating solution used in the DC plating may include an accelerator, a suppressor, or the like, and may further include a leveler. Accordingly, the plating solution used in the DC plating may be different from that used in the PPR plating. As a surface of the third metal layer 133, formed by DC plating, is required to be uniformly formed, it may be preferable that the plating solution used in the DC plating include a leveler, in contrast to the plating solution used in the PPR plating.

Meanwhile, an average size of grains in the third metal layer 133 may be smaller than that in the first region 132A of the second metal layer 132 and larger than that in the second region 132B of the second metal layer 132. For example, the average sizes of grains in the metal layer may be larger in the order of that in the first region 132A of the second metal layer 132, that of the third metal layer 133 and that of the second region 132B of the second metal layer 132.

Meanwhile, the average size of grains in the third metal layer 133 may be smaller than that of the second metal layer 132. Specifically, the average size of grains in the third metal layer 133 may be smaller than that in an overall region of the second metal layer 132, including the first and second regions 132A and 132B of the second metal layer 132.

Depending on formation conditions of the second plating layer 132, however, the average size of grains in the third metal layer 133 may be larger than that of the second average size of grains 132. For example, in the case in which the second region 132B of the second metal layer 132 is formed to be large, the average size of grains in the second metal layer 132 may be reduced, and in this case, the average size of grains in the third metal layer 133 may be larger than that of the second metal layer 132.

Meanwhile, an interface between the second and third metal layers 132 and 133 may not be clear and may be difficult to observe with the naked eye. Further, the interface between the second and third metal layers 132 and 133 may not have a smooth shape. In addition, an interface between the first and second regions 132A and 132B of the second metal layer 132 may not be clear and may be difficult to observe with the naked eye.

Meanwhile, when a blind via is formed on a printed circuit board, it is preferable that a filled-type via in which the via hole is filled with a metal material be formed for high heat dissipation properties, and the like. Due to limitations on technologies which have currently been developed, however, there are problems of voids and dimples generated when filled-type vias are formed in a large size. In this case, not only substrate reliability can be problematic but also it is difficult to implement a stack via structure advantageous in heat dissipation or signal delivery properties of the substrate. Meanwhile, a via is generally formed to extend onto a substrate when filling a via hole, and in this case, a metal layer extended onto the substrate has a large thickness. To reduce the thickness of the metal layer, an additional process, such as etching, may be necessary.

According to the present disclosure, a portion of the via hole VH is filled with the second metal layer 132 including a region 132A having a large average size of grains through PPR plating, and the remaining portion is filled with the third metal layer 133 having a small average size of grains through DC plating, thereby forming the via 130. Meanwhile, it is obvious that the first metal layer 131 may be further formed on the wall surface and bottom surface of the via hole VH by electroless plating, or the like, before the second metal layer 132 is formed.

It was confirmed that in the case in which the via 130 is formed by the plating method disclosed in the present disclosure, the via hole VH can be filled with the second and third metal layers 132 and 133 without having voids and dimples generated. In this regard, a printed circuit board having excellent reliability can be provided by preventing void generation. Further, the stack via structure can be easily achieved by preventing dimple generation, and a printed circuit board having excellent heat dissipation properties and capable of rapid signal delivery. Besides, according to the present disclosure, a thickness of a metal layer extended onto a substrate may be reduced, and thus, an additional process, such as etching, is not required, thereby simplifying manufacturing processes and reducing manufacturing costs.

Figure 3:
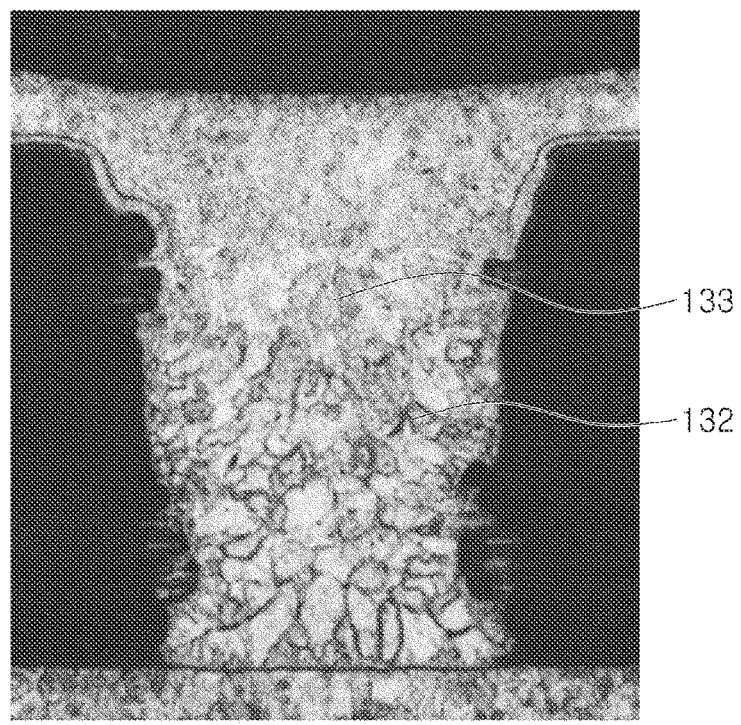
FIG. 3 is a photographic image illustrating a cross-sectional view of a via of a printed circuit board according to an example embodiment observed by an optical microscope.

FIG. 3 is a photographic image illustrating a cross-sectional view of a via of a printed circuit board according to an example embodiment observed by an optical microscope.

As previously described, the first metal layer 131 is formed on the wall and bottom surfaces of the via hole VH by electroless plating, and the second metal layer 132 is formed to fill a portion of the via hole VH by PPR plating, followed by forming the third metal layer 133 to fill the remaining of the via hole VH by DC plating.

During the PPR plating, the via hole was filled with large grains by managing an average current density to be 0.5 ASD to 5 ASD, and a plating thickness was controlled by a reverse current.

It was observed through an optical microscope that an average size of grains in the second metal layer 132 formed by PPR plating is larger than that of the third metal layer 133 formed by DC plating. Further, a thickness of the second metal layer 132 on the top surface of the insulating layer was formed to be significantly small.

Figure 4:
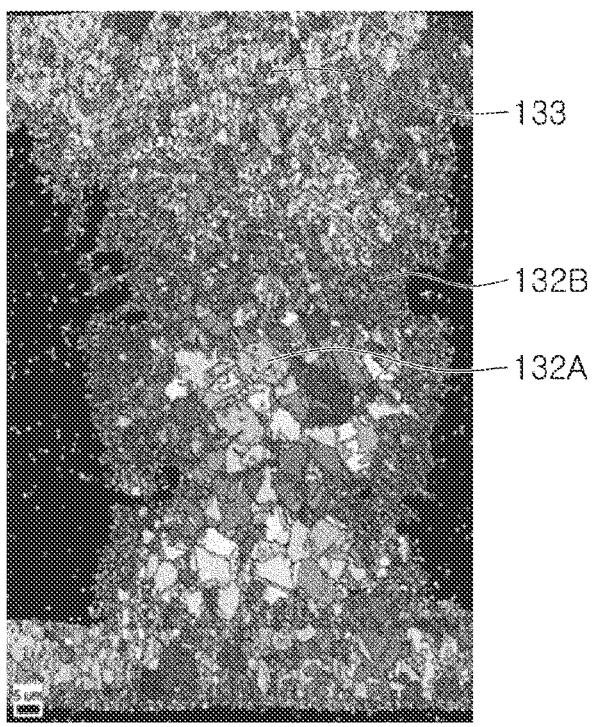
FIG. 4 is a diagram illustrating an analysis of a via of a printed circuit board using electron back scatter diffraction (EBSD)

FIG. 4 is a diagram illustrating an analysis of a via of a printed circuit board using electron back scatter diffraction (EBSD).

The second metal layer 132 and the third metal layer 133 formed by PPR plating and DC plating, respectively, were analyzed using EESD to more precisely analyze the average sizes of grains thereof, and as a result, it was confirmed that the second metal layer 132 has the first region 132A and the second region 132B having different average sizes of grains.

Specifically, based on the drawings, the average size of grains in the first region 132A of the second metal layer 132 is larger than that in the second region 132B of the second metal layer 132. That is, the second metal layer 132 further has the second region 132B having a significantly small average size of grains, in addition to the first region 132A having a large average size of grains.

Further, the average size of grains in the third metal layer 133 is smaller than that in the first region 132A of the second metal layer 132 and is larger than that in the second region 132B of the second metal layer 132.

Figure 5:
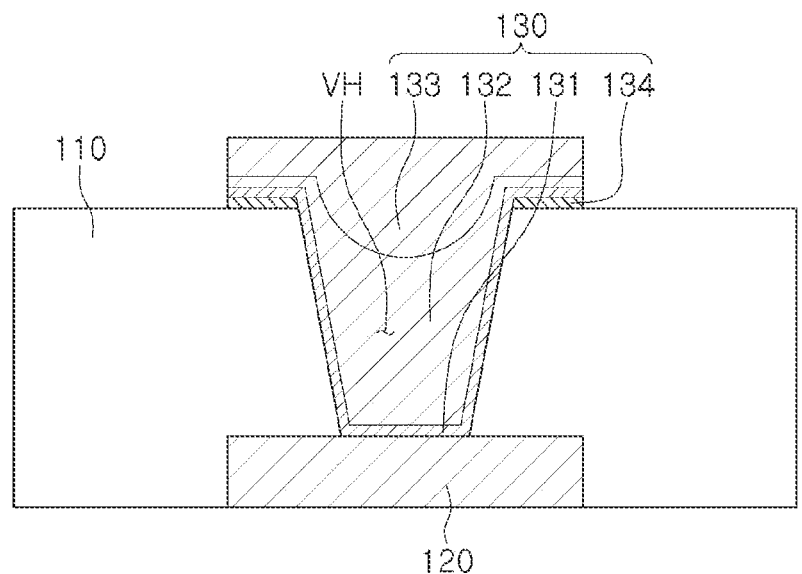
FIG. 5 is a cross-sectional view schematically illustrating a printed circuit board according to another example embodiment.

FIG. 5 is a cross-sectional view schematically illustrating a printed circuit board according to another example embodiment.

Referring to FIG. 5, a printed circuit board according to another example embodiment further includes a fourth metal layer 134 disposed on the top surface of an insulating layer.

The fourth metal layer 134 may be a thin metal film attached to the top surface of the insulating layer 110. For example, a thin metal film stacked board, in which a metal thin film such as a copper glad is attached to at least the top surface of the insulating layer 110, may be used as the insulating layer. When forming a printed circuit board, a portion of the thin metal film is not removed and remains, thereby forming the fourth metal layer 134.

The first metal layer 131 may be disposed on the fourth metal layer 134 on the top surface of the insulating layer 110. As previously described, however, the first metal layer is able to be omitted, and the second metal layer 132 and/or the third metal layer 133 may be disposed on the fourth metal layer 134 on the top surface of the insulating layer 110.

Figure 6:
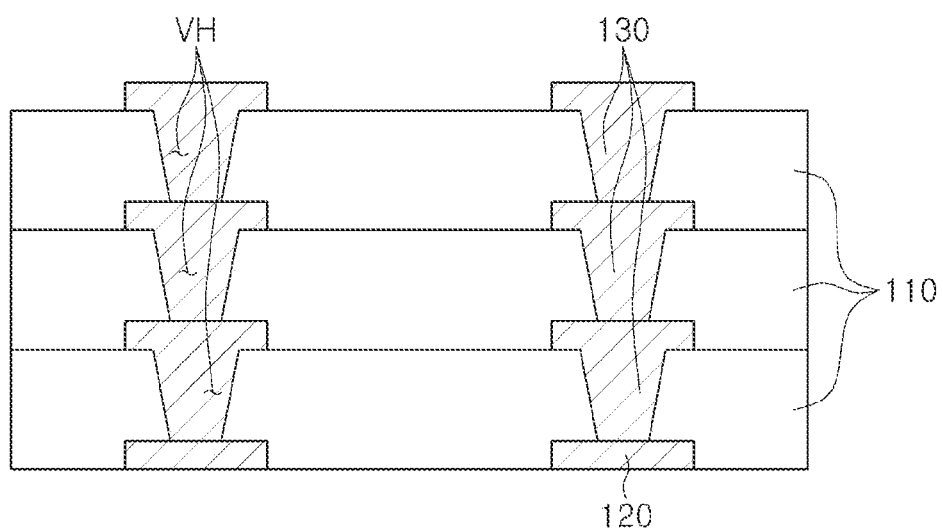
FIG. 6 is a cross-sectional view schematically illustrating a multilayer printed circuit board according to an example embodiment.

FIG. 6 is a cross-sectional view schematically illustrating a multilayer printed circuit board according to an example embodiment.

Referring to FIG. 6, a multilayer printed circuit board includes a plurality of insulating layers 110, a plurality of metal pads 120, a plurality of via holes VH and a plurality of vias 130.

In this case, a plurality of the insulating layers 110 are stacked, and a plurality of the metal pads 120 are disposed on one side of a plurality of the insulating layers 110. A plurality of the via holes VH penetrate a plurality of the insulating layers 110 to expose at least a portion of a plurality of the metal layer 120, and a plurality of the vias 130 fill a plurality of the via holes VH.

Meanwhile, at least two of a plurality of the vias 130 may overlap each other in a direction in which the insulating layers 110 are stacked. That is, at least two of a plurality of the vias 130 may have a stack via structure. Such structure may provide a printed circuit board having excellent heat dissipation properties and capable of rapid signal delivery.

Throughout the specification, it will be understood that when an element is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Accordingly, a first member, component, region, layer or section discussed below could be termed a second member, component, region, layer or section without departing from the teachings of the exemplary embodiments.

The terminology used herein describes particular example embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

As set forth above, as an effect of the present disclosure, a printed circuit board capable of preventing the occurrence of voids in a via may be provided.

As another effect of the present disclosure, a printed circuit board having excellent reliability may be provided.

As another effect of the present disclosure, a printed circuit board capable of preventing the occurrence of dimples of a via may be provided.

As another effect of the present disclosure, a printed circuit board including a stack via may be provided.

As another effect of the present disclosure, a printed circuit board having excellent heat dissipation properties may be provided.

As another effect of the present disclosure, a printed circuit board capable of rapid signal delivery may be provided.

As another effect of the present disclosure, a printed circuit board capable of reducing a plating thickness may be provided.

As another effect of the present disclosure, a printed circuit board having simplified manufacturing processes and reduced manufacturing costs may be provided.

While exemplary embodiments have been shown and described above, it will be apparent to those skilled in the art that modifications and variations could be made without departing from the scope of the present embodiment as defined by the appended claims.

What is claimed is:

1. A printed circuit board, comprising: an insulating layer; a metal pad disposed on one side of the insulating layer; a via hole penetrating through the insulating layer to expose at least a portion of the metal pad; and a via filling at least a portion of the via hole, wherein the via comprises a first metal layer, a second metal layer directly disposed on a top of the first metal layer, and a third metal layer directly disposed on the second metal layer, wherein the first metal layer, the second metal layer, and the third metal layer are arranged upwardly from the metal pad in the listed order, and an average size of grains in the second metal layer is larger than an average size of grains in the third metal layer.

2. The printed circuit board of claim 1, wherein the second metal layer comprises a concave portion indented toward the metal pad on an interface between the second metal layer and the third metal layer, and
    the third metal layer fills at least a portion of the concave portion.

3. The printed circuit board of claim 1, wherein the second metal layer comprises a first region and a second region, and
    average sizes of grains in the first region and in the second region of the second metal layer are different from each other.

4. The printed circuit board of claim 3, wherein the first region of the second metal layer is disposed inside the via, and
    the second region of the second metal layer is disposed outside the via and surrounds the first region.

5. The printed circuit board of claim 4, wherein the average size of grains in the first region of the second metal layer is larger than the average size of grains in the second region, and
    the average size of grains in the first region of the second metal layer is larger than the average size of grains in the third metal layer.

6. The printed circuit board of claim 5, wherein a third metal layer is disposed on the second metal layer, and an average size of grains in the third metal layer is smaller than the average size of grains in the first region of the second metal layer and larger than the average size of grains in the second region of the second metal layer.

7. The printed circuit board of claim 1, wherein the third metal layer covers at least a portion of a region exposed through the via hole of the metal pad and at least a portion of a wall surface of the via hole, and
    the third metal layer is disposed on a part of the first metal layer.

8. The printed circuit board of claim 7, wherein the first to third metal layers extend onto a top surface of the insulating layer.

9. The printed circuit board of claim 8, wherein a thickness of the third metal layer is greater than a thickness of the second metal layer on the top surface of the insulating layer.

10. The printed circuit board of claim 8, wherein the via further comprises a fourth metal layer disposed on the top surface of the insulating layer, and
    the first metal layer is disposed on the fourth metal layer on the top surface of the insulating layer.

11. The printed circuit board of claim 1, wherein the insulating layer, the metal pad, the via hole and the via respectively comprise a plurality of the insulating layers, a plurality of the metal pads, a plurality of the via holes and a plurality of the vias,
    wherein:
    the plurality of the insulating layers are stacked,
    the plurality of the metal pads are disposed on one side of the plurality of the insulating layers,
    the plurality of the via holes penetrate a plurality of the insulating layers to expose at least a portion of a plurality of the metal pads,
    the plurality of the vias fill the plurality of the via holes, and
    at least two of the plurality of the vias overlap in a direction in which the insulating layers are stacked.

12. A printed circuit board, comprising: an insulating layer; a metal pad disposed on one side of the insulating layer; a via hole penetrating through the insulating layer to expose at least a portion of the metal pad; and a via filling at least a portion of the via hole, wherein the via comprises a first metal layer directly disposed on the portion of the metal pad, a second metal layer comprising a first region and a second region and directly disposed on the first metal layer, and a third metal layer directly disposed on the second metal layer, wherein the first metal layer, the second metal layer, and the third metal layer are arranged upwardly from the metal pad in the listed order, and average sizes of grains in the first region and the second region of the second metal layer are different from each other, and an average size of grains in first region of the second metal layer is larger than an average size of grains in the third metal layer.

13. The printed circuit board of claim 12, wherein the first region of the second metal layer is disposed inside the via, and
    the second region of the second metal layer is disposed outside the via and surrounds the first region.

14. The printed circuit board of claim 13, wherein an average size of grains in the first region of the second metal layer is larger than an average size of grains in the second region.

15. The printed circuit board of claim 14, wherein an average size of grains in the third metal layer is smaller than the average size of grains in the first region of the second metal layer and larger than the average size of grains in the second region.

16. The printed circuit board of claim 1, wherein the second metal layer does not extend onto a top surface of the insulating layer.

17. The printed circuit board of claim 1, wherein a third metal layer is directly disposed the first metal layer disposed on the top surface of the insulating layer.

18. A printed circuit board, comprising: an insulating layer; a metal pad disposed on one side of the insulating layer; a via hole penetrating through the insulating layer to expose at least a portion of the metal pad; and a via filling at least a portion of the via hole, wherein the via comprises a first metal layer, a second metal layer comprising a first region and a second region and directly disposed on a top of the first metal layer, and a third metal layer directly disposed on a top of the second metal layer, wherein the first metal layer, the second metal layer, and the third metal layer are arranged upwardly from the metal pad in the listed order, and average sizes of grains in the first region and in the second region of the second metal layer are different from each other, an average size of grains in the first region of second metal layer is larger than an average size of grains in the third metal layer, and an interface between the first region and the second region of the second metal layer is inside of the via hole.

19. The printed circuit board of claim 18, wherein an average size of grains in the first region of the second metal layer is larger than an average size of grains in the second region of the second metal layer.

20. The printed circuit board of claim 12, wherein
the average size of grains in the second region of the second metal layer is smaller than the average size of grains in the third metal layer.

* * * * *